(12) United States Patent
Cho et al.

(10) Patent No.: US 8,969,128 B2
(45) Date of Patent: Mar. 3, 2015

(54) METHOD OF FABRICATING THIN FILM TRANSISTOR SUBSTRATE AND ORGANIC LIGHT EMITTING DISPLAY DEVICE USING THE SAME

(75) Inventors: Yoon-dong Cho, Gyeonggi-do (KR);
Jong-Hyun Park, Seoul (KR);
Soo-Young Yoon, Gyeonggi-do (KR);
Mi-Jung Lee, Gyeonggi-do (KR);
Jae-kyung Choi, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 187 days.

(21) Appl. No.: 13/534,245

(22) Filed: Jun. 27, 2012

(65) Prior Publication Data

US 2013/0240888 A1 Sep. 19, 2013

(30) Foreign Application Priority Data

Mar. 13, 2012 (KR) ........................ 10-2012-0025458

(51) Int. Cl.
*H01L 51/40* (2006.01)

(52) U.S. Cl.
USPC .............................. 438/99; 257/40

(58) Field of Classification Search
CPC ............ H01L 51/0545; H01L 51/0541; H01L 51/0036; B82Y 10/00; B82Y 30/00
USPC .......................................................... 438/99
See application file for complete search history.

(56) References Cited

FOREIGN PATENT DOCUMENTS

| | | | |
|---|---|---|---|
| JP | 2011-113091 A | 6/2011 |
| KR | 10-1999-0070139 A | 9/1999 |
| KR | 10-2010-0051499 A | 5/2010 |
| KR | 10-2010-0068661 A | 6/2010 |

OTHER PUBLICATIONS

Machine Translation of KR 10-2010-0068661.*

* cited by examiner

*Primary Examiner* — Anthony Ho
(74) *Attorney, Agent, or Firm* — Morgan, Lewis & Bockius LLP

(57) ABSTRACT

A method of fabricating a thin film transistor substrate includes: forming a polymer layer on a glass substrate; forming a passivation layer on the polymer layer; forming a thin film transistor array on the passivation layer; and separating the glass substrate from the polymer layer by irradiating a laser from a rear surface of the glass substrate.

13 Claims, 3 Drawing Sheets

METHOD OF FABRICATING THIN FILM TRANSISTOR SUBSTRATE AND ORGANIC LIGHT EMITTING DISPLAY DEVICE USING THE SAME

This application claims the benefit of Korean Patent Application No. 10-2012-0025458, filed on Mar. 13, 2012, which is hereby incorporated by reference in its entirety.

BACKGROUND

1. Field of the Disclosure

The present disclosure relates to a method of fabricating a thin film transistor substrate and an organic light emitting display device using the thin film transistor substrate, and more particularly, to a method of fabricating a thin film transistor substrate and an organic light emitting display device using the thin film transistor substrate where a flexible display is obtained.

2. Discussion of the Related Art

Recently, multimedia devices, such as an organic light emitting display (OLED) device, a liquid crystal display (LCD) device, an electrophoretic display (EPD) device, a plasma display panel (PDP) device, a thin film transistor (TFT), a microprocessor and a random access memory (RAM), have been developed, and thus the importance of a flexible electric element has increased. Regarding the various display devices, it has been an interest of the industry whether a typical process of a thin film transistor (TFT) can be applied for an active matrix organic light emitting display (AMOLED) device having a highest possibility for a flexible display.

Specifically, properties, such as a thin profile, a light weight and an unbreakable property, are required for a mobile device, such as a digital camera, a video camera, a personal digital assistant (PDA) and a portable phone. Accordingly, a flat panel display (FPD) is fabricated by using a thin glass substrate. Alternatively, after a FPD is fabricated using a typical glass substrate, a thickness of the typical glass substrate is reduced through a mechanical method or a chemical method.

A typical glass substrate for a FPD has an advantage of stability in a process for forming an electrode or a TFT. However, since the typical glass substrate is hard and heavy, the typical glass substrate is not adequate for a flexible display as a display for mobile communication. Accordingly, a transparent and pliable plastic substrate has been suggested for a flexible display.

However, a plastic substrate is heat-resistant up to a relatively low range of about 150° C. to about 200° C. Since it is hard to perform a heat treatment for a transparent electrode formed on a plastic substrate through a sputtering method using indium-tin oxide (ITO), there exist several limitations on reduction of resistivity of the transparent electrode. In addition, since a thermal expansion coefficient of an ITO electrode is smaller as compared with that of a polymer plastic substrate, the ITO electrode and the plastic substrate expand with different rates from each other due to long heat history during a fabrication process or during an operation of a FPD. As a result, the plastic substrate is deformed. In a fabrication process of a low temperature polycrystalline silicon (LTPS), specifically, since a temperature of a substrate increases up to a range of about 400° C. to about 500° C., it is hard to adopt a plastic substrate.

In addition, since a plastic substrate has a relatively low strength, the plastic substrate is easy to be broken or cracked. Further, the plastic substrate may be warped and a resistance of an electrode on the plastic substrate may increase.

For the purpose of solving the above problems, a method using a carrier substrate has been suggested. After a separation layer is formed on a carrier substrate, such as a glass substrate, a plastic substrate is formed on the separation layer by coating a plastic material, and a thin film transistor array is formed on the plastics substrate. Next, the plastics substrate is separated from the carrier substrate.

However, the above method using a carrier substrate has a disadvantage of forming an additional separation layer. In addition, since a carrier substrate is hard to support a weight due to a property of a plastic substrate, it is hard to handle the plastic substrate.

SUMMARY

The present disclosure is directed to a method of fabricating a thin film transistor substrate and an organic light emitting display device using the thin film transistor substrate that obviate one or more of the problems due to limitations and disadvantages of the related art.

One of advantages of the present disclosure is to provide a method of fabricating a thin film transistor substrate and an organic light emitting display device using the thin film transistor substrate where a flexible display is obtained without an additional process of forming a separation layer and an adhesive layer and deterioration due to a foreign substance is improved.

Additional features and advantages of the invention will be set forth in the description herein, and in part will be apparent from the description, or may be learned by practice of the invention. These and other advantages of the invention may be realized and attained by the structure particularly pointed out in the written description and claims hereof as well as the appended drawings.

In one aspect, to achieve these and other advantages and in accordance with some purposes of the present invention a method of fabricating a thin film transistor substrate may include: forming a polymer layer on a glass substrate; forming a passivation layer on the polymer layer; forming a thin film transistor array on the passivation layer; and separating the glass substrate from the polymer layer by irradiating a laser from a rear surface of the glass substrate.

In another aspect, a method of fabricating an organic light emitting display device may include: forming a polymer layer on a glass substrate; forming a passivation layer on the polymer layer; forming a thin film transistor array including a gate electrode, a source electrode, a drain electrode and a semiconductor layer contacting the source and drain electrodes on the passivation layer; forming a first electrode electrically connected to one of the source and drain electrodes; forming an organic emitting layer and a second electrode on the first electrode; and separating the glass substrate from the polymer layer by irradiating a laser from a rear surface of the glass substrate.

In another aspect, an organic light emitting display device may include: a polymer layer including a polyimide (PI) material having a repeating unit expressed by a first chemical formula; a passivation layer on the polymer layer; a thin film transistor array including a gate electrode, a source electrode, a drain electrode and a semiconductor layer on the passivation layer; and a first electrode electrically connected to one of the source and drain electrodes, an organic emitting layer and a second electrode.

[First Chemical Formula]

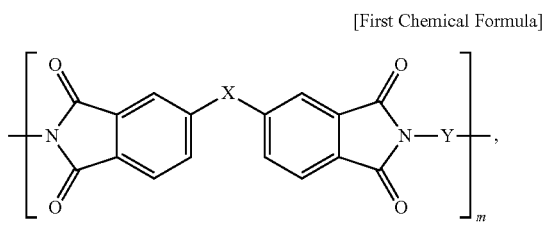

where X includes one of alkyl, aryl, alkoxy, acyl, aralkyl, amino, arylamino, alkylamino, aralkylamino, alkoxy, aryloxy or aralkyloxy (e.g. —O—, —CO—, —S—, —SO$_2$—, —C(CH$_3$)$_2$—, —CONH—, —(CH$_2$)$_{n1}$—, —O(CH$_2$)$_{n2}$O—, —COO(CH$_2$)$_{n3}$OCO— and halogen, where each of n1, n2 and n3 is independently an integer equal to or greater than 1 and equal to or smaller than 100), where m is an integer equal to or greater than 1 and equal to or smaller than 10000, and where Y is a 2-valent aromatic moiety expressed by a second chemical formula.

[Second Chemical Formula]

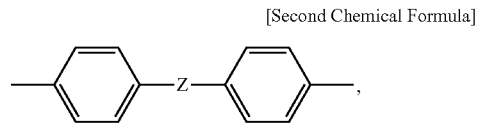

where Z is selected from a group including a carbonyl group, a phosphate group, an anhydride group and a thiol group.

It is to be understood that both the foregoing general description and the following detailed description are exemplary and explanatory and are intended to provide exemplary embodiments of the invention as claimed.

BRIEF DESCRIPTION OF THE DRAWINGS

The accompanying drawings are included to provide a further understanding of the invention and are incorporated in and constitute a part of this specification. The drawings illustrate exemplary embodiments of the invention and together with the description serve to explain the principles of the invention.

DETAILED DESCRIPTION OF THE ILLUSTRATED EMBODIMENTS

Reference will be made in detail to exemplary embodiments of the present invention, examples of which are illustrated in the accompanying drawings. Wherever possible, similar reference numbers will be used to refer to the same or similar parts.

Figure 1:
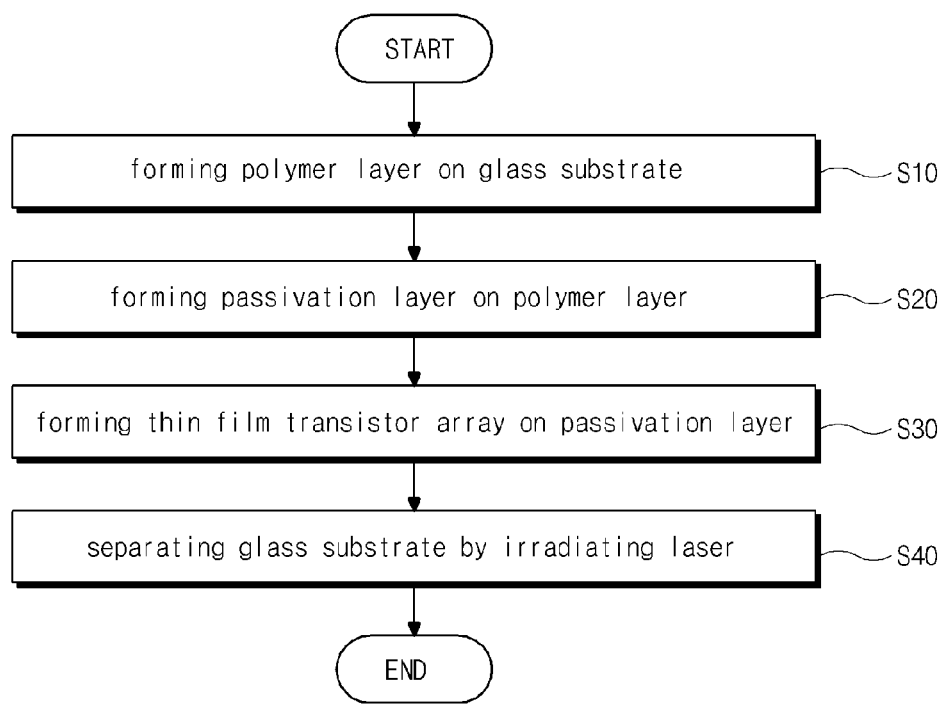
FIG. 1 is a flow chart showing a method of fabricating a thin film transistor substrate according to some embodiments of the present invention.
Figure 2:
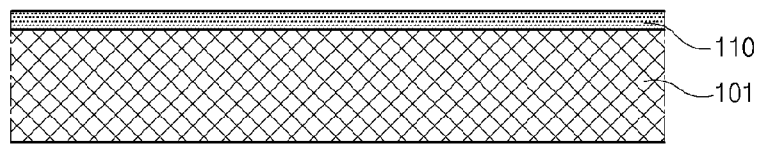
FIGS. 2 to 4 are cross-sectional views showing a method of fabricating a thin film transistor substrate according to additional embodiments of the present invention.
Figure 3:
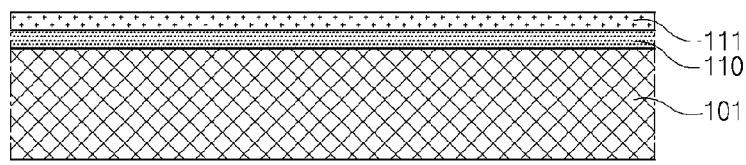
Figure 4:
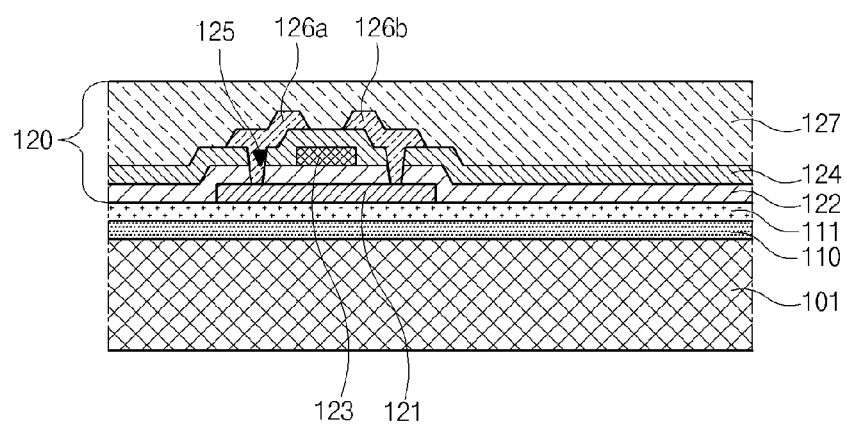

FIG. 1 is a flow chart showing a method of fabricating a thin film transistor substrate according to some embodiments of the present invention, and FIGS. 2 to 4 are cross-sectional views showing a method of fabricating a thin film transistor substrate according to additional embodiments of the present invention.

Referring to FIGS. 1 and 2, a polymer layer 110 may be formed on a glass substrate 101 (step S10). The polymer layer 110 may be formed of a polyimide material including one or more of a carbonyl group, a phosphate group, an anhydride group and a thiol group. For example, the polymer layer 110 may be formed of a polyimide (PI) material having a repeating unit expressed by a first chemical formula below or a photopolymer having at least one of a carbonyl group, a phosphate group, an anhydride group and a thiol group.

[First Chemical Formula]

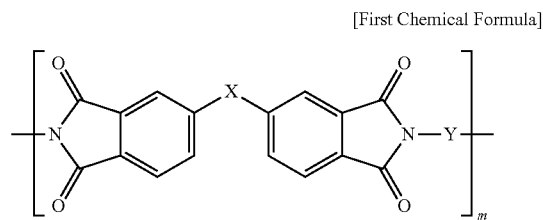

Here, X may be alkyl, aryl, alkoxy, acyl, aralkyl, amino, arylamino, alkylamino, aralkylamino, alkoxy, aryloxy or aralkyloxy. In some embodiments, X may be substituted. In further embodiments, X may include at least one of —O—, —CO—, —S—, —SO$_2$—, —C(CH$_3$)$_2$—, —CONH—, —(CH$_2$)$_{n1}$—, —O(CH$_2$)$_{n2}$O—, —COO(CH$_2$)$_{n3}$OCO— and halogen, where each of n1, n2 and n3 is independently an integer equal to or greater than 1 and equal to or smaller than 100, and m is an integer equal to or greater than 1 and equal to or smaller than 10000. In additional embodiments, each of n1, n2 and n3 is independently an integer equal to or greater than 1 and equal to or smaller than 2, 3, 4, 5, 6, 7, 8, 9, 10, 20, 30, 40, 50, 60, 70, 80, 90, 100, 300, 1000, or 10000, and m is an integer equal to or greater than 1 and equal to or smaller than 5, 10, 20, 30, 40, 50, 60, 70, 80, 90, 100, 200, 300, 400, 500, 600, 700, 800, 900, 1000, 5000, or 10000

In addition, Y is a 2-valent aromatic moiety expressed by a second chemical formula below.

[Second Chemical Formula]

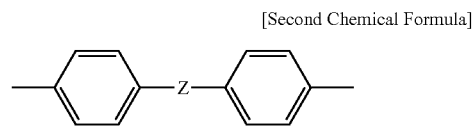

Here, Z may be selected from the group including a carbonyl group, a phosphate group, an anhydride group, a thiol group, and a mixture thereof.

The polyimide material having the repeating unit expressed by the first chemical formula may be synthesized from acid dianhydride and diamine. For example, acid dianhydride and diamine may be copolymerized and imidized to form a polyimide material. In addition, one or a mixture of alicyclic acid dianhydride and aromatic acid dianhydride may be used as acid dianhydride.

Here, alicyclic acid dianhydride may include one or a mixture of 1,2,3,4-cyclobutane tetracarboxylic dianhydride (CBDA), 5-(2,5-dioxotetrahydrofuryl)-3-methyl-3-cyclohexene-1,2-dicarboxylic anhydride (DOCDA), bicyclooctene-2,3,5,6-tetracarboxylic dianhydride (BODA), 1,2,3,4-cyclopentanetetracarboxylic dianhydride (CPDA), 1,2,4,5-cyclohexanetetracarboxylic dianhydride (CHDA), 1,2,4-tricarboxy-3-methylcarboxy cyclopentane dianhydride, 1,2,3,4-tetracarboxy cyclopentane dianhydride and 4,10-dioxatricyclo[6.3.1.0$^{2,7}$]dodecane-3,5,9,11-tetraone.

In addition, aromatic acid dianhydride may include one or a mixture of 4,4'-oxydiphthalic dianhydride (ODPA), pyromellitic dianhydride (PMDA), 3,3',4,4'-biphenyl tetracarboxylic dianhydride (BPDA), 3,3',4,4'-Benzophenone tetracarboxylic dianhydride (BTDA), Ethylene glycol bis(anhydro trimellitate) (TMEG) and 2,2'-bis[4-(dicarboxyphenoxy) phenyl]propane dianhydride (BSAA).

For example, 4,4'-oxydiphthalic dianhydride (ODPA) may be expressed by a third chemical formula below.

[Third Chemical Formula]

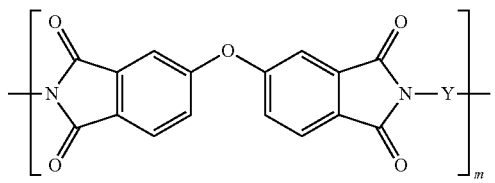

Since Y of the third formula is a 2-valent aromatic moiety including at least one of a carbonyl group, a phosphate group, an anhydride group and a thiol group, adhesion force exists between the glass substrate 101 and the polymer layer 110 when the polymer layer 110 includes 4,4'-oxydiphthalic dianhydride (ODPA) expressed by the third chemical formula. As a result, an additional separation layer or an additional adhesive layer is not required.

In addition, when a laser is irradiated onto the polymer layer 110 including a 2-valent aromatic moiety (e.g. Y expressed by the second chemical formula) including at least one of a carbonyl group, a phosphate group, an anhydride group and a thiol group (step S40), some of the chemical bonds (e.g. C=O, P=O or S=O) of polymer layer 110 are broken, and a gas, (e.g. $CO_2$, $SO_2$ or $PO_3$) is generated. Accordingly, here, performance of separation of the glass substrate 101 and the polymer layer 110 is improved. As a result, irradiation time may be reduced even when the intensity of laser is decreased On the other hand, when the polymer layer includes oxydiphthalic anhydride-oxydianiline (ODPA-ODA) expressed by a fourth chemical formula below, where Y is a 2-valent aromatic moiety including an ether group, an additional adhesive layer may be required because the glass substrate and the polymer layer have a poor adhesion force. In addition, since a gas is not generated at the step of laser irradiation, performance of separation of the glass substrate and the polymer layer may be poor as compared with using the polymer layer with the third chemical formula above.

[Fourth Chemical Formula]

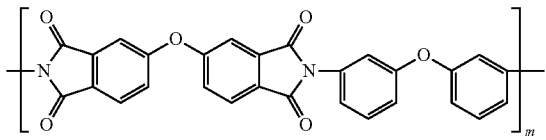

Referring to FIGS. 1 and 3, a passivation layer 111 may be formed on the polymer layer 110 (step S20). For example, the passivation layer 111 may include an inorganic insulating material, such as silicon nitride (SiNx) and silicon oxide (SiOx). The passivation layer 111 may prevent external moisture or external gas from permeating and/or diffusing into the polymer layer 110 and may planarize the polymer layer 110.

Referring to FIGS. 1 and 4, a thin film transistor (TFT) array 120 may be formed on the passivation layer 111 (step S30). For example, the TFT array 120 may include a semiconductor layer 121, a first insulating layer 122, a gate electrode 123, a second insulating layer 124, first contact holes 125, a source electrode 126a, a drain electrode 126b and a planarizing layer 127 sequentially formed on the passivation layer 111.

The semiconductor layer 121 may include amorphous silicon and/or polycrystalline silicon. In some embodiments, after the semiconductor layer 121 is formed of amorphous silicon, amorphous silicon may be crystallized through a low temperature polycrystalline silicon (LTPS) process to become polycrystalline silicon. In the LTPS process, a temperature of a substrate may increase up to a range of about 400° C. to about 500° C. Since the polymer layer 110 has an excellent heat-resistance, the LTPS process may be performed to the semiconductor layer 121 over the polymer layer 110 without deterioration. The heat-resistance property of the polymer layer 110 is also illustrated herein.

The first insulating layer 122 insulates the gate electrode 123 from the semiconductor layer 121. For example, the first insulating layer 122 may include at least one of an inorganic insulating material (e.g. silicon nitride (SiNx) and silicon oxide (SiOx)) and an organic insulating material (e.g. benzocyclobutene (BCB) and acrylic resin). In addition, the second insulating layer 124 may include at least one of an inorganic insulating material (e.g. silicon nitride (SiNx) and silicon oxide (SiOx)) and an organic insulating material (e.g. benzocyclobutene (BCB) and acrylic resin).

The gate electrode 123 may include a conductive material. For example, the gate electrode 123 may include at least one of magnesium (Mg), aluminum (Al), nickel (Ni), chromium (Cr), molybdenum (Mo), tungsten (W), molybdenum tungsten (MoW) and gold (Au). In addition, the gate electrode 123 may have a single-layered structure or a multiple-layered structure.

The first contact holes 125 may be formed in the first and second insulating layers 122 and 124 by selectively removing a portion of the first and second insulating layers 122 and 124 to expose source and drain regions of the semiconductor layer 121.

The source and drain electrodes 126a and 126b are formed on the second insulating layer 124. Each of the source and drain electrodes 126a and 126b may include a conductive material, such as magnesium (Mg), aluminum (Al), nickel (Ni), chromium (Cr), molybdenum (Mo), tungsten (W), molybdenum tungsten (MoW) and gold (Au), for example, and may have a single-layered structure or a multiple-layered structure. The source and drain electrodes 126a and 126b may be connected to the source and drain regions, respectively, through the first contact holes 125. The semiconductor layer 121, the first insulating layer 122, the gate electrode 123, the source electrode 126a and the drain electrode 126b may constitute a thin film transistor (TFT).

The planarizing layer 127 is formed on the source and drain electrodes 126a and 126b. The planarizing layer 127 may planarize and protect the TFT. For example, the planarizing layer 127 may include at least one of an inorganic insulating material (e.g. silicon nitride (SiNx) and silicon oxide (SiOx)) and an organic insulating material (e.g. benzocyclobutene (BCB) and acrylic resin). In addition, the planarizing layer 127 may have a single-layered structure or a multiple-layered structure.

An organic light emitting diode may be formed on the TFT array. Although an organic light emitting diode is formed on the TFT array in an embodiment of FIG. 5, any of other various display elements, such as a liquid crystal display element and an electrophoretic display element, may be formed on the TFT array in additional embodiments.

In some embodiments, the organic light emitting diode may include an organic light emitting array having a bank layer and a sealing means (not shown).

Figure 5:
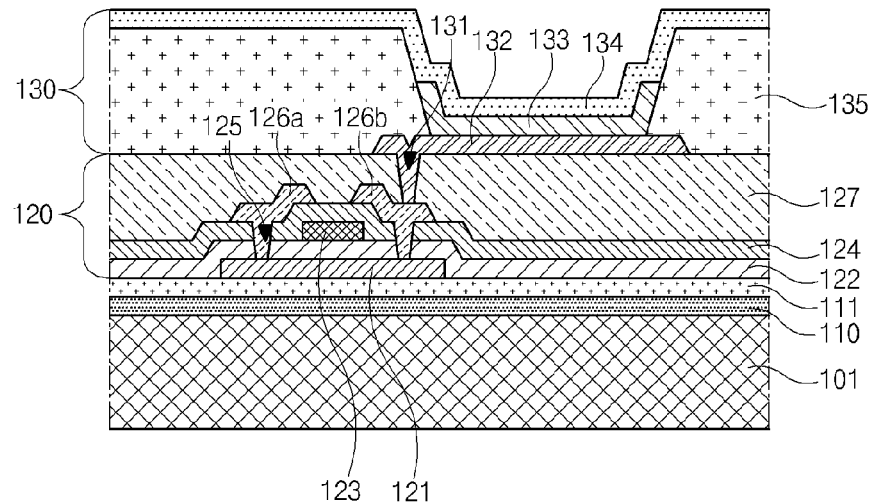
FIG. 5 is a cross-sectional view showing a method of fabricating an organic light emitting display device according to yet additional embodiment of the present invention.

FIG. 5 is a cross-sectional view showing a method of fabricating an organic light emitting display device according to some embodiments of the present disclosure.

Referring to FIG. 5, an organic light emitting array 130 may include a first electrode 132, an organic emitting layer 133 and a second electrode 134. The first electrode 132 may be formed on the planarizing layer 127, and the organic emitting layer 133 and the second electrode 134 may be sequentially formed on the first electrode 132. A second contact hole 131 is formed in the planarizing layer 127 to expose one of the source and drain electrodes 126a and 126b. The first electrode 132 is electrically connected to one of the source and drain electrodes 126a and 126b through the second contact hole 131.

The first electrode 132 may include a conductive material and may function as one electrode of an organic light emitting diode. In addition, the first electrode 132 may have a transparent electrode and/or a reflective electrode. For example, the first electrode 132 of a transparent electrode may include at least one of indium-tin oxide (ITO), indium-zinc-oxide (IZO), zinc-oxide (ZnO) and indium-oxide ($In_2O_3$). In addition, the first electrode 132 of a reflective electrode array may include at least one of silver (Ag), magnesium (Mg), aluminum (Al), platinum (Pt), palladium (Pd), gold (Au), nickel (Ni), neodymium (Nd), iridium (Ir), chromium (Cr) and compound thereof. Further, a transparent conductive material layer including one of indium-tin oxide (ITO), indium-zinc-oxide (IZO), zinc-oxide (ZnO) and indium-oxide ($In_2O_3$) may be formed on a reflective conductive material layer including one of silver (Ag), magnesium (Mg), aluminum (Al), platinum (Pt), palladium (Pd), gold (Au), nickel (Ni), neodymium (Nd), iridium (Ir), chromium (Cr) and compound thereof to form the first electrode 132 of a reflective electrode.

A bank layer 135 may be formed between the first and second electrodes 132 and 134. The bank layer 135 may have an open portion exposing the first electrode 132 corresponding to a pixel region, and the organic emitting layer 133 may be formed in the open portion of the bank layer 135 on the first electrode 132. The bank layer 135 may include at least one of an inorganic insulating material (e.g. silicon nitride (SiNx) and silicon oxide (SiOx)) and an organic insulating material (e.g. benzocyclobutene (BCB) and acrylic resin).

The organic emitting layer 133 may have a single-layered structure of an emitting material. Alternatively, the organic emitting layer 133 may have a multiple-layered structure for improving an emission efficiency. For example, the organic emitting layer 133 of a multiple-layered structure may include a hole injecting layer (HIL), a hole transporting layer (HTL), an emitting material layer (EML), an electron transporting layer (ETL) and an electron injecting layer (EIL).

The second electrode 134 may have a transparent electrode and/or a reflective electrode. For example, the second electrode 134 of a transparent electrode may include at least one of lithium (Li), calcium (Ca), lithium fluoride/calcium (LiF/Ca), lithium fluoride/aluminum (LiF/Al), aluminum (Al), magnesium (Mg) and compound thereof. In addition, a transparent conductive material layer may include at least one of indium-tin oxide (ITO), indium-zinc-oxide (IZO), zinc-oxide (ZnO) and indium-oxide ($In_2O_3$) and may be formed on a reflective conductive material layer to form the second electrode 134 of a transparent electrode. Here, the reflective conductive material layer may include at least one of lithium (Li), calcium (Ca), lithium fluoride/calcium (LiF/Ca), lithium fluoride/aluminum (LiF/Al), aluminum (Al), magnesium (Mg) and compound thereof. The transparent conductive material layer may be used for an auxiliary electrode or a bus line. Further, the second electrode 138 of a reflective electrode may include at least one of lithium (Li), calcium (Ca), lithium fluoride/calcium (LiF/Ca), lithium fluoride/aluminum (LiF/Al), aluminum (Al), magnesium (Mg) and compound thereof.

Accordingly, in an organic light emitting display (OLED) device according to some embodiments of the present invention, when voltages corresponding to a selected color signal are applied to the first and second electrodes 132 and 134, a hole and an electron may be transported to the organic emitting layer 133 to constitute an exciton. When the exciton in an excited state changes to a ground state, a light may be generated and emitted as a visible ray. The light emitted from the organic emitting layer 133 may pass through the second electrode 134 to display an image.

Although not shown, an encapsulation process may be performed for protecting the organic light emitting diode from an exterior. For example, an encapsulation process may be performed using a thin film encapsulation method.

Referring again to FIG. 1, a laser may be irradiated to the polymer layer 110 to soften the polymer layer 110, and the glass substrate 101 may be separated from the polymer layer 110 (step S40).

Figure 6:
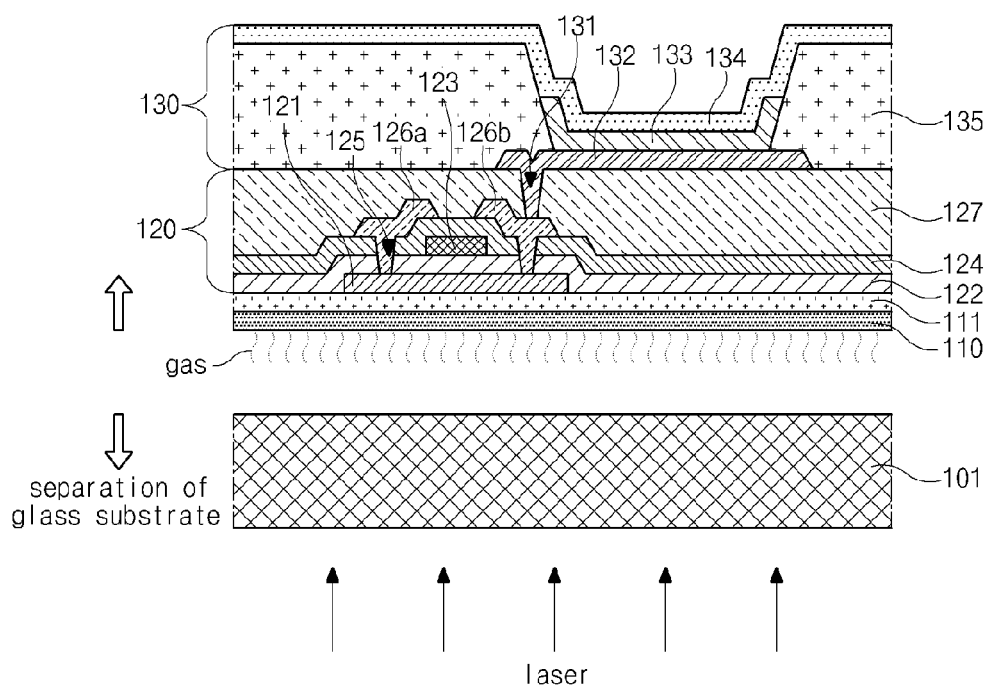
FIG. 6 is a cross-sectional view showing a method of separating a glass substrate from a polymer layer of an organic light emitting display device according to further embodiments of the present invention.

FIG. 6 is a cross-sectional view showing a method of separating a glass substrate from a polymer layer of an organic light emitting display device according to additional embodiments of the present disclosure.

Referring to FIG. 6, a laser may be irradiated to the polymer layer 110 from a rear surface of the glass substrate 101. Since the polymer layer 110 may be heat up to a glass transition temperature (Tg), i.e., a temperature where the polymer layer 110 of a glassy state transitions to a rubbery state, by laser irradiation, the glass substrate 101 may be easily separated from the polymer layer 110. For example, the glass transition temperature of the polymer layer 110 may be about 300° C., and the laser having a wavelength of about 308 nm to about 355 nm may be irradiated to the polymer layer 110 to soften the layer.

Although the glass substrate 101 may be used for transmitting the laser in some embodiments (e.g. as shown in FIG. 6), the other transparent substrate may be used in additional embodiments. In addition, although the glass substrate 101 may be separated by laser irradiation after forming the organic light emitting array in some embodiments (e.g. as shown in FIG. 6), the glass substrate 101 may be separated after forming the sealing means in additional embodiments. In addition, the glass substrate 101 may be separated after forming the TFT array and various display elements may be formed on the polymer layer 110 in yet additional embodiments.

A heat-resistance experiment was performed depending on the kind and concentration of a polymer material to verify whether a thin film transistor substrate having a polymer layer may be adopted to a low temperature polycrystalline silicon (LTPS) process where a temperature of a substrate increases up to a range of about 400° C. to about 500° C.

Comparative Example

After a precursor layer was formed on a non-alkaline glass substrate of 150 mm×150 mm by spin-coating a solution of poly(methylene-bis-anthranilamide) 1,6-hexamethylenedicarboxylic acid (PAA-5), the precursor layer was thermally cured at about 450° C. for about 60 min to form a polymer layer. As a result, the polymer layer according to the comparative example was detached from the glass substrate in a large portion of the layer during the high temperature curing process.

Example 1

After a precursor layer was formed on a non-alkaline glass substrate of 150 mm×150 mm by spin coating a solution of 3,3',4,4'-Benzophenone tetracarboxylic dianhydride (BTDA) of about 30 mol %, the precursor layer was thermally cured at about 450° C. for about 60 min to form a polymer layer. As a result, detachment of the polymer layer from the glass substrate during the high temperature curing process was significantly reduced as compared with the comparative example above.

Example 2

After a precursor layer was formed on a non-alkaline glass substrate of 150 mm×150 mm by spin coating a solution of 3,3',4,4'-Benzophenone tetracarboxylic dianhydride (BTDA) of about 50 mol %, the precursor layer was thermally cured at about 450° C. for about 60 min to form a polymer layer. As a result, the polymer layer was detached from the glass substrate only in a small portion of the layer during the high temperature curing process, and the adhesion of the polymer layer was superior to that of the polymer layer from Comparative Example or Example 1.

Example 3

After a precursor layer was formed on a non-alkaline glass substrate of 150 mm×150 mm by spin coating a solution of 3,3',4,4'-Benzophenone tetracarboxylic dianhydride (BTDA) of about 100 mol %, the precursor layer was thermally cured at about 450° C. for about 60 min to form a polymer layer. As a result, the polymer layer was not detached from the glass substrate and stayed adhered to the glass substrate in all portion during the high temperature curing process, showing superior adhesion compared to the polymer layers from the other examples.

Consequently, in the method of fabricating a thin film transistor substrate and an organic light emitting display device using the thin film transistor substrate, an additional process for a separation layer or an adhesive layer described herein may not be required and deterioration of the thin film transistor substrate due to a foreign substance may be improved. As a result, fabrication process may be simplified, and the separated glass substrate may be reusable. In addition, since a polymer layer has an excellent heat-resistance, the thin film transistor substrate may be adopted to a low temperature polycrystalline silicon (LTPS) process having a thermally curing step at a relatively high temperature. Accordingly, the thin film transistor substrate applicable to a flexible display may be provided, and an organic light emitting display device using the thin film transistor substrate may be provided.

It will be apparent to those skilled in the art that various modifications and variations can be made in the present disclosure without departing from the spirit or scope of the invention. Thus, it is intended that the present invention cover the modifications and variations of this invention provided they come within the scope of the appended claims and their equivalents.

What is claimed is:

1. A method of fabricating a thin film transistor substrate, comprising:
    forming a polymer layer directly on a glass substrate;
    forming a passivation layer on the polymer layer;
    forming a thin film transistor array on the passivation layer; and
    separating the glass substrate from the polymer layer by irradiating the polymer layer with a laser from a rear surface of the glass substrate.

2. The method according to claim 1, wherein the polymer layer comprises a polyimide (PI) material having a first chemical formula

[First Chemical Formula]

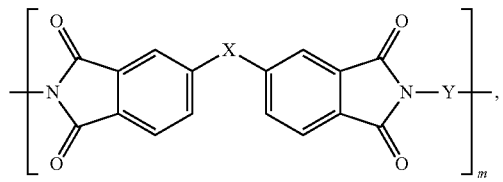

wherein:
X is alkyl, aryl, alkoxy, acyl, aralkyl, amino, arylamino, alkylamino, aralkylamino, alkoxy, aryloxy or aralkyloxy,
m is an integer equal to or greater than 1 and equal to or less than 10000, and
Y is a divalent aromatic moiety expressed by a second chemical formula

[Second Chemical Formula]

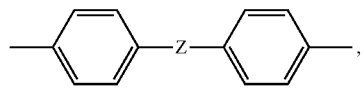

wherein Z is selected from the group consisting of a carbonyl group, a phosphate group, an anhydride group, a thiol group, and a mixture thereof.

3. The method according to claim 2, wherein X includes at least one selected from the group consisting of —O—, —CO—, —S—, —SO$_2$—, —C(CH$_3$)$_2$—, —CONH—(CH$_2$)$_{n1}$—, —O(CH$_2$)$_{n2}$O—, —COO(CH$_2$)$_{n3}$OCO— and halogen, and each of n1, n2 and n3 is independently an integer equal to or greater than 1 and equal to or less than 100.

4. The method according to claim 1, wherein the thin film transistor array comprises a gate electrode, a source electrode, a drain electrode and a semiconductor layer; and the semiconductor layer comprises amorphous silicon and/or polycrystalline silicon.

5. The method according to claim 4, wherein the portion of the semiconductor layer is crystallized by increasing temperature to a range of about 400° C. to about 500° C.

6. The method according to claim 1, wherein the glass substrate is reusable.

7. A method of fabricating an organic light emitting display device, comprising:
    forming a polymer layer directly on a glass substrate;
    forming a passivation layer on the polymer layer;

forming a thin film transistor array on the passivation layer;
forming a first electrode electrically connected to the thin film transistor array;
forming an organic emitting layer and a second electrode on the first electrode; and
separating the glass substrate from the polymer layer by irradiating the polymer layer with a laser from a rear surface of the glass substrate.

8. The method according to claim 7, wherein the thin film transistor comprises a gate electrode, a source electrode, a drain electrode, and a semiconductor layer contacting the source and drain electrode; and the first electrode is electrically connected to one of the source and drain electrodes.

9. The method according to claim 7, wherein the polymer layer comprises a polyimide (PI) material having a first chemical formula

[First Chemical Formula]

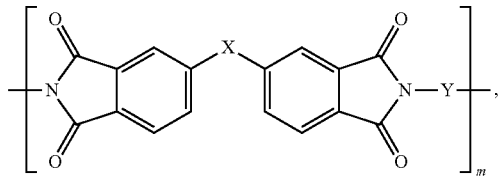

wherein:
X is alkyl, aryl, alkoxy, acyl, aralkyl, amino, arylamino, alkylamino, aralkylamino, alkoxy, aryloxy or aralkyloxy, m is an integer equal to or greater than 1 and equal to or less than 10000, and
Y is a divalent aromatic moiety expressed by a second chemical formula

[Second Chemical Formula]

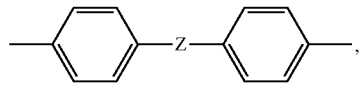

wherein Z is selected from the group consisting of a carbonyl group, a phosphate group, an anhydride group, a thiol group, and a mixture thereof.

10. The method according to claim 9, wherein X includes at least one selected from the group consisting of —O—, —CO—, —S—, —SO$_2$—, —C(CH$_3$)$_2$—, —CONH—, —(CH$_2$)$_{n1}$—, —O(CH$_2$)$_{n2}$O—, —COO(CH$_2$)$_{n3}$OCO— and halogen, and each of n1, n2 and n3 is independently an integer equal to or greater than 1 and equal to or less than 100.

11. The method according to claim 1, wherein the semiconductor layer comprises amorphous silicon and/or polycrystalline silicon.

12. The method according to claim 11, wherein the portion of the semiconductor layer is crystallized by increasing temperature to a range of about 400° C. to about 500° C.

13. The method according to claim 7, wherein the glass substrate is reusable.

* * * * *